United States Patent
Jeon et al.

(10) Patent No.: US 7,687,821 B2
(45) Date of Patent: Mar. 30, 2010

(54) GALLIUM NITRIDE BASED LIGHT EMITTING DIODE

(75) Inventors: Dong Min Jeon, Suwon (KR); Jae Ho Han, Daejeon (KR); Pil Geun Kang, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 169 days.

(21) Appl. No.: 11/647,266

(22) Filed: Dec. 29, 2006

(65) Prior Publication Data

US 2007/0166861 A1  Jul. 19, 2007

(30) Foreign Application Priority Data

Jan. 2, 2006 (KR) .................. 10-2006-0000055
Dec. 13, 2006 (KR) .................. 10-2006-0127330

(51) Int. Cl.
*H01L 33/00* (2006.01)
*H01L 27/15* (2006.01)
*H01L 31/12* (2006.01)

(52) U.S. Cl. .................. 257/99; 257/79; 257/95; 257/E33.055; 257/E33.064

(58) Field of Classification Search .................. 257/79, 257/95, 99, E33.028, E33.055, E33.064
See application file for complete search history.

(56) References Cited

U.S. PATENT DOCUMENTS

| | | | | |
|---|---|---|---|---|
| 6,893,889 B2* | 5/2005 | Park et al. | ..................... | 438/22 |
| 7,411,221 B2* | 8/2008 | Cho et al. | ..................... | 257/79 |
| 2001/0004112 A1* | 6/2001 | Furukawa et al. | ............... | 257/7 |
| 2004/0012033 A1* | 1/2004 | Yoo | ......................... | 257/103 |
| 2006/0081857 A1* | 4/2006 | Hong et al. | .................... | 257/84 |
| 2006/0157718 A1* | 7/2006 | Seo et al. | ...................... | 257/82 |

FOREIGN PATENT DOCUMENTS

JP  2004-172189   6/2004
JP  2004-172189 A   6/2004

* cited by examiner

*Primary Examiner*—Shouxiang Hu
(74) *Attorney, Agent, or Firm*—McDermott Will Emery LLP

(57) ABSTRACT

A GaN-based LED comprises a substrate; an an-type GaN layer formed on the substrate; an active layer formed on a predetermined region of the n-type GaN layer; a p-type GaN layer formed on the active layer; a transparent electrode formed on the p-type GaN layer; a p-electrode formed on the transparent electrode; an n-type electrode formed on the n-type GaN layer on which the active layer is not formed; and a protective film formed on a resulting structure between the transparent electrode and the n-type electrode, the protective film being composed of a plasma-oxidized transparent layer.

9 Claims, 4 Drawing Sheets

[FIG. 1A] PRIOR ART
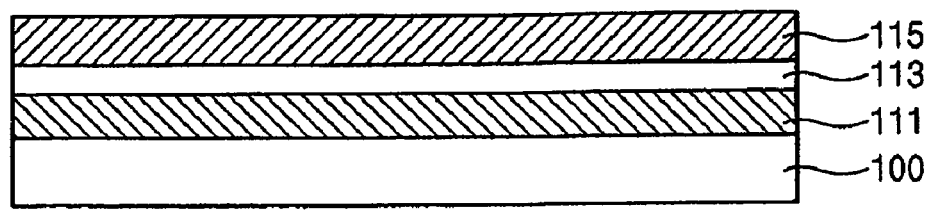
[FIG. 1B] PRIOR ART
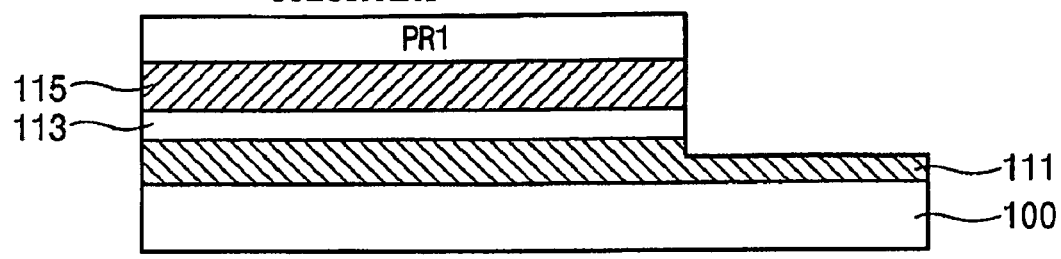
[FIG. 1C] PRIOR ART
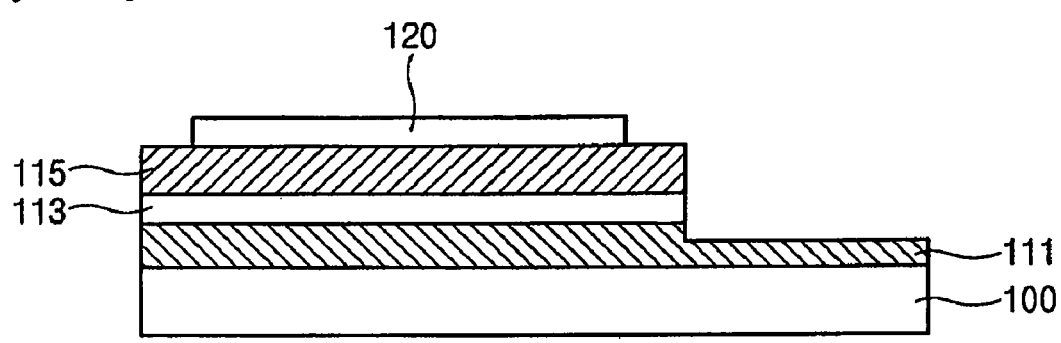
[FIG. 1D] PRIOR ART
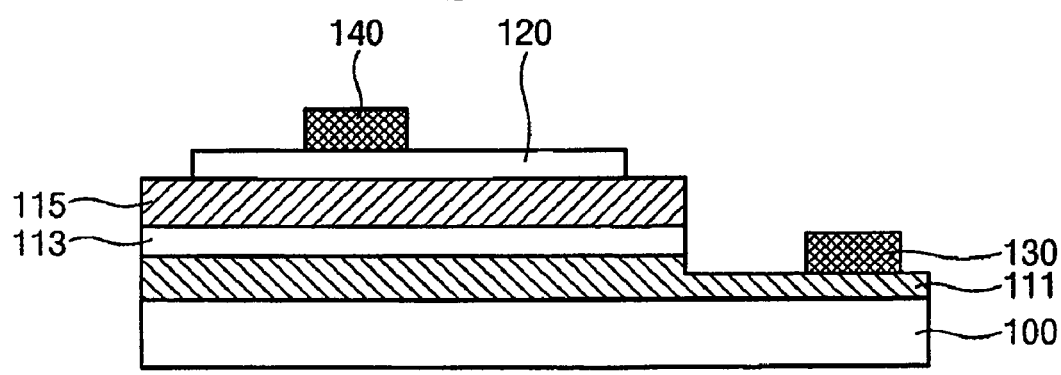

[FIG. 1E] PRIOR ART
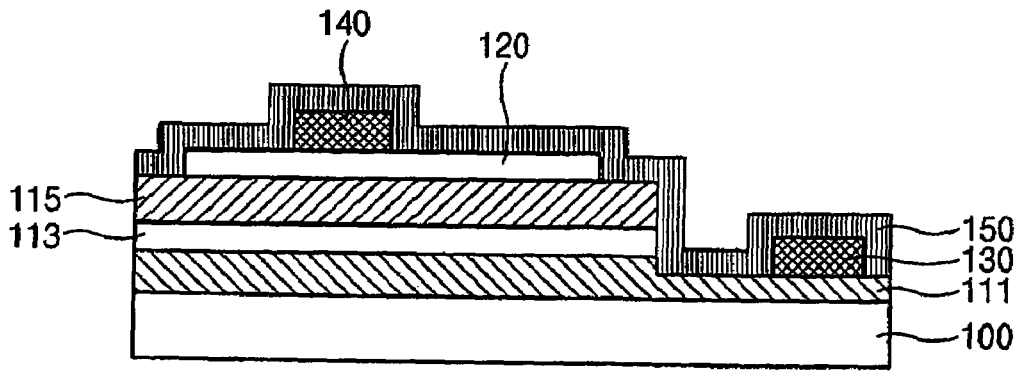
[FIG. 1F] PRIOR ART
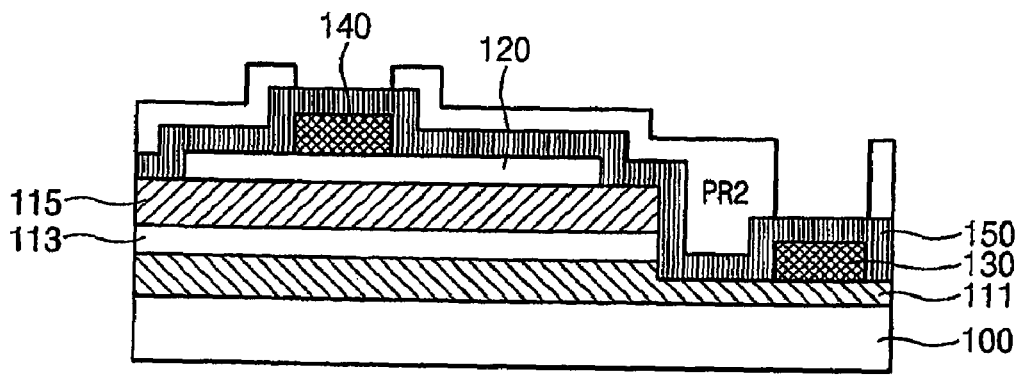
[FIG. 1G] PRIOR ART
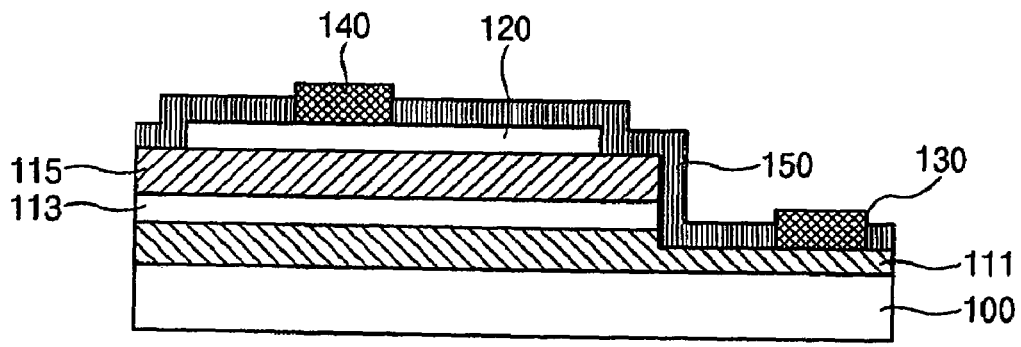
[FIG. 2]
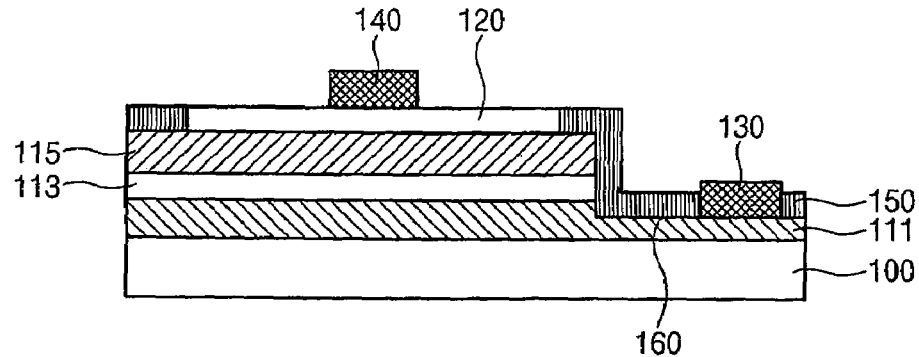

[FIG. 3A]
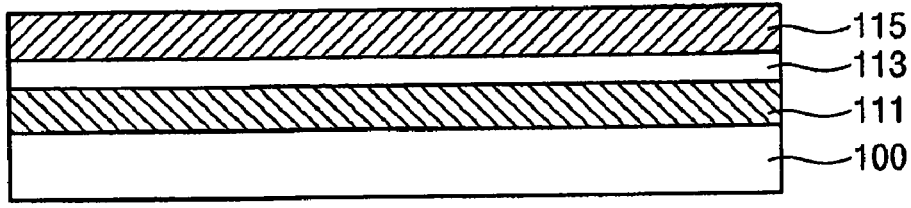
[FIG. 3B]
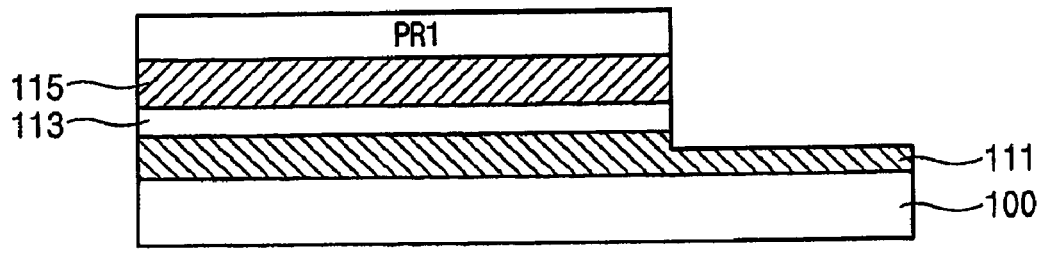
[FIG. 3C]
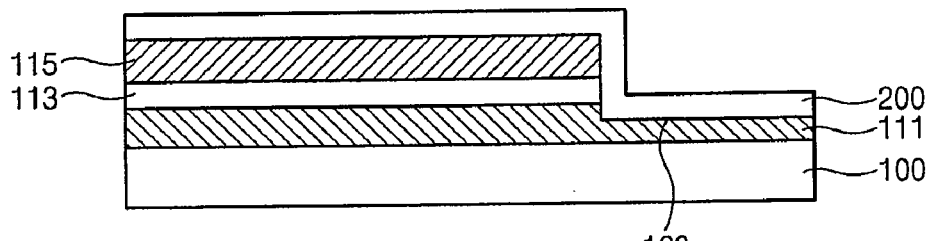
[FIG. 3D]
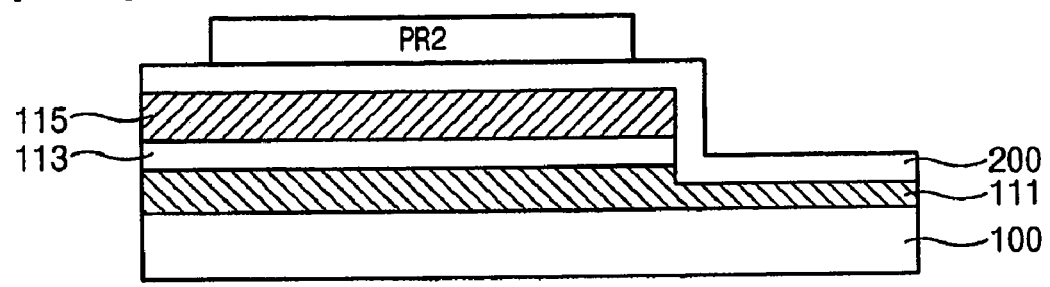
[FIG. 3E]
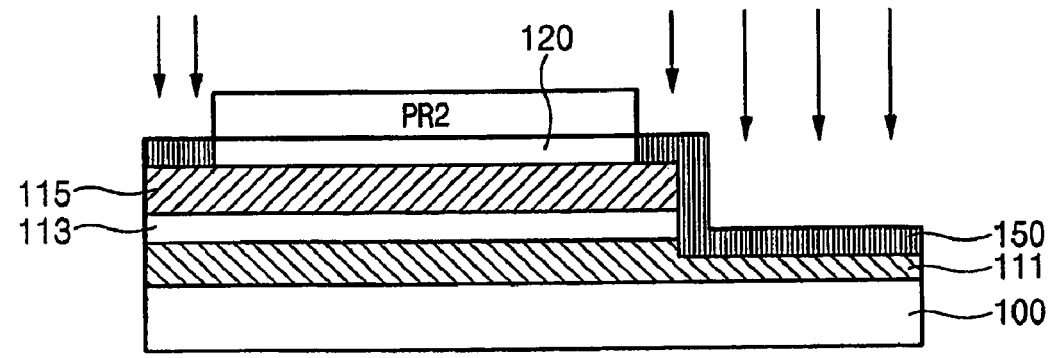

[FIG. 3F]
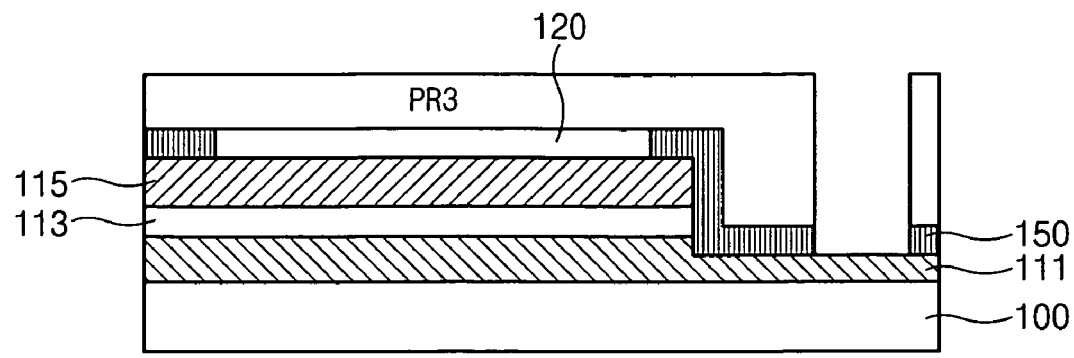
[FIG. 3G]
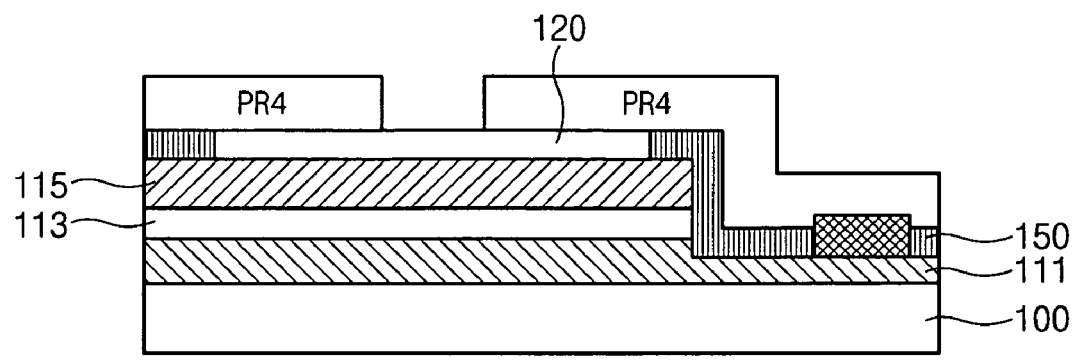
[FIG. 3H]
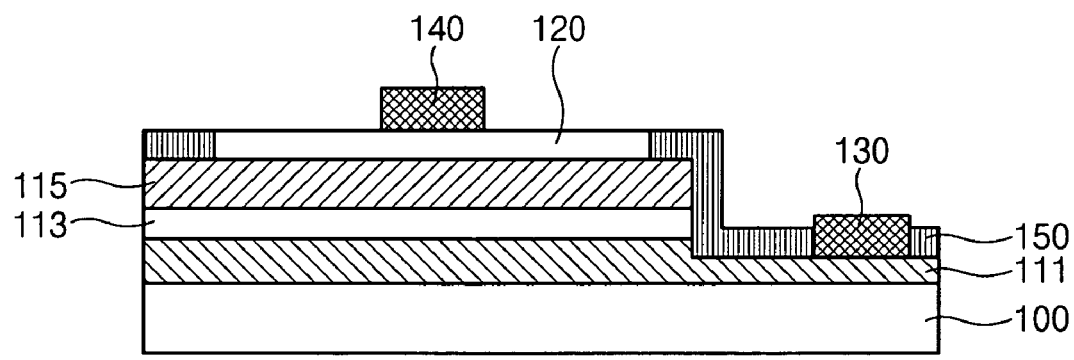

GALLIUM NITRIDE BASED LIGHT EMITTING DIODE

CROSS-REFERENCE TO RELATED APPLICATIONS

This application claims the benefit of Korean Patent Application No. 10-2006-0000055 filed with the Korean Intellectual Property Office on Jan. 2, 2006 and Korean Patent Application No. 10-2006-0127330 filed with the Korean Intellectual Property Office on Dec. 13, 2006, the disclosure of which is incorporated herein by reference.

BACKGROUND OF THE INVENTION

1. Field of the Invention

The present invention relates to a method of manufacturing a gallium nitride based light emitting diode (hereinafter, referred to as a GaN-based LED), which can simplify the overall manufacturing process of a GaN-based LED having a transparent electrode and a protective film.

2. Description of the Related Art

In general, a nitride semiconductor is such a material that has a relatively high energy band gap (in the case of GaN semiconductor, about 3.4 eV), and is positively adopted in an optical element for generating green or blue short-wavelength light. As such a nitride semiconductor, a material having a compositional formula of $Al_xIn_yGa_{(1-x-y)}N$ (herein, $0 \leq x \leq 1$, $0 \leq y \leq 1$, and $0 \leq x+y \leq 1$) is widely used.

Since GaN-based semiconductor crystal can be grown on an insulating substrate such as a sapphire substrate, electrodes cannot be formed on the rear surface of the substrate as in a GaAs-based LED. Therefore, both electrodes should be formed in the side of a crystal-grown semiconductor layer.

For this, a process of forming a mesa structure is required. In the mesa-structure, some regions of an upper clad layer and an active layer are removed so that a portion of the top surface of a lower clad layer is exposed.

Since a p-type GaN layer formed of the upper clad layer has relatively high resistance, an additional layer is required in which ohmic contacts can be formed by using a typical electrode. Accordingly, before an electrode is formed on a p-type GaN layer in the related art, an Ni/Au transparent electrode is formed so as to form ohmic contacts, thereby reducing a forward voltage $V_f$. As for the transparent electrode, an ITO (indium titanium oxide) film may be used.

As such, the mesa structure formation process, the transparent electrode formation process, and the bonding electrode formation process are needed in order to manufacture a GaN-based LED according to the related art. Additionally, a protective film formation process is separately accompanied in manufacturing a GaN-based LED. Therefore, the overall manufacturing process becomes complex. Such complexness can be found in a process example shown in FIGS. 1A to 1G FIGS. 1A to 1G are sectional views sequentially showing a process for explaining a method of manufacturing a GaN-based LED according to the related art.

As shown in FIG. 1A, the process begins with a primary growth process in which an n-type GaN layer 111, an active layer 113, and a p-type GaN layer 115 are sequentially formed on a transparent insulating substrate 100 formed of sapphire. At this time, the n-type GaN layer 111, the active layer 113, and the p-type GaN layer 115 can be formed by such a well-known nitride growth process as MOCVD.

Next, as shown in FIG. 1B, a process of forming a mesa structure is performed in order to form an n-electrode (not shown) on the top surface of the n-type GaN layer 111. More specifically, the mesa structure formation process includes forming first photoresist PR1 on the top surface of the p-type GaN layer 115 excluding a region to be etched; and etching and removing predetermined regions of the p-type GaN layer 115 and the active layer 113 by using the first photoresist PR1 as an etching mask such that a portion of the top surface of the n-type GaN layer 111 is exposed.

Subsequently, after the first photoresist PR1 for forming the mesa structure is removed, a transparent electrode 120 is formed on a predetermined region of the p-type GaN layer 115 exposed by removing the first photoresist PR1, as shown in FIG. 1C.

After that, as shown in FIG. 1D, a p-electrode 140 and an n-electrode 130 are formed on the transparent electrode 120 and the exposed n-type GaN layer 111, respectively, through a typical electrode formation process.

Then, as shown in FIG. 1E, a protective film 150 formed of such a material as $SiO_2$ or SiN is formed on the entire top surface of the resulting structure where the p-electrode 140 and the n-electrode 130 are formed.

Subsequently, as shown in FIG. 1F, second photoresist PR2 is formed on the top surface 150 such that portions of the protective film 150 corresponding to the p-electrode 140 and the n-electrode 130 are exposed.

Next, as shown in FIG. 1G, the protective film 150 is selectively etched and removed with the second photoresist PR2 set to an etching mask. Accordingly, the p-electrode 104 and the n-electrode 130 are exposed.

As described above, in the method of manufacturing a GaN-based LED according to the related art, the overall manufacturing process is complex. Further, since a $SiO_2$ or SiN film used as the protective film has poor adhesion performance with the electrodes, that is, the transparent electrode 120, the p-electrode 140, and the n-electrode 130, defective adhesion (for example, the film can be peeled off) occurs, thereby reducing characteristics and reliability of the diode.

SUMMARY OF THE INVENTION

An advantage of the present invention is that it provides a GaN-based LED in which a transparent electrode and a protective film are simultaneously formed by using a transparent layer composed of an indium oxide without a separate etching process. Therefore, the overall manufacturing process is simplified, and simultaneously, the adhesive performance between the protective film and an electrode is enhanced, thereby preventing defective adhesion.

Another advantage of the invention is that it provides a method of manufacturing the above-described GaN-based LED.

Additional aspect and advantages of the present general inventive concept will be set forth in part in the description which follows and, in part, will be obvious from the description, or may be learned by practice of the general inventive concept.

According to an aspect of the invention, a GaN-based LED comprises a substrate; an an-type GaN layer formed on the substrate; an active layer formed on a predetermined region of the n-type GaN layer; a p-type GaN layer formed on the active layer; a transparent electrode formed on the p-type GaN layer; a p-electrode formed on the transparent electrode; an n-type electrode formed on the n-type GaN layer on which the active layer is not formed; and a protective film formed on a resulting structure between the transparent electrode and the n-type electrode, the protective film being composed of a plasma-oxidized transparent layer.

According to another aspect of the invention, the protective film is formed is the resulting structure between the transparent electrode and the n-type electrode and may be composed of a transparent layer subjected to an ashing process.

According to a further aspect of the invention, the transparent layer is composed of a compound formed by adding one or more elements, selected from a group consisting of tin, zinc, magnesium, copper, silver, and aluminum, into an indium oxide. The elements are added by 1 to 30 wt % of the overall compound.

According to a still further aspect of the invention, the GaN-based LED further comprises an adhesive layer formed between the protective film and the surface of the resulting structure between the transparent electrode and the n-electrode.

According to a still further aspect of the invention, the adhesive layer is composed of a compound formed by adding one or more elements, selected from a group consisting of tin, zinc, magnesium, copper, silver, and aluminum, into an indium oxide, the adhesive layer being formed by adding different elements from those added into the transparent layer.

According to a still further aspect of the invention, the adhesive layer is composed of a compound formed by adding one or more elements, selected from a group consisting of tin, zinc, magnesium, copper, silver, and aluminum, into an indium oxide, the adhesive layer being formed by adding a different amount of elements from an amount of those added into the transparent layer.

According to a still further aspect of the invention, the GaN-based LED further comprises a buffer layer formed between the substrate and the n-type GaN layer.

According to a still further aspect of the invention, a method of manufacturing a GaN-based LED comprising sequentially forming an n-type GaN layer, an active layer, and a p-type GaN layer on a substrate; mesa-etching portions of the p-type GaN layer, the active layer, and the n-type GaN layer so as to expose a portion of the top surface of the n-type GaN layer; forming a transparent layer on the entire surface of the resulting structure where a portion of the n-type GaN layer is exposed; forming a mask on the top surface of the transparent layer, the mask opening a region of the transparent layer excluding a transparent electrode formation region; and performing a plasma oxidation process on the transparent layer exposed through the mask, thereby forming a protective film.

According to a still further aspect of the invention, the protective film can be formed by performing an ashing process on the transparent layer exposed through the mask.

According to a still further aspect of the invention, the transparent layer may be composed of a compound formed by adding one or more elements, selected from a group consisting of tin, zinc, magnesium, copper, silver, and aluminum, into an indium oxide. The elements are added by 1 to 30 wt % of the overall compound.

According to a still further aspect of the invention, the method further comprises forming an adhesive layer on the entire surface of the resulting structure where a portion of the n-type GaN layer is exposed, before the forming of the transparent layer.

According to a still further aspect of the invention, the adhesive layer is composed of a compound formed by adding one or more elements, selected from a group consisting of tin, zinc, magnesium, copper, silver, and aluminum, into an indium oxide, the adhesive layer being formed by adding different elements from those added into the transparent layer.

According to a still further aspect of the invention, the adhesive layer is composed of a compound formed by adding one or more elements, selected from a group consisting of tin, zinc, magnesium, copper, silver, and aluminum, into an indium oxide, the adhesive layer being formed by adding a different amount of elements from an amount of those added into the transparent layer.

According to a still further aspect of the invention, the method further comprises, after the performing of the plasma oxidation process, removing the mask; selectively etching a portion of the protective film formed on the n-type GaN layer so as to expose a portion of the n-type GaN layer; forming an n-electrode on the exposed n-type GaN layer; and forming a p-electrode on the transparent electrode formation region of the transparent layer.

According to a still further aspect of the invention, the method further comprises forming a buffer layer on the substrate, before the forming of the n-type GaN layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1G are sectional views sequentially showing a process for explaining a method of manufacturing a GaN-based LED according to the related art;

FIG. 2 is a sectional view illustrating the structure of a GaN-based LED according to an embodiment of the invention; and FIGS. 3A to 3H are sectional views sequentially showing a process for explaining a method of manufacturing a GaN-based LED according to the an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a GaN-based LED and a method of manufacturing the same according to an embodiment of the present invention will be described in detail with reference to the accompanying drawings.

Structure of GaN-Based LED

Referring to FIG. 2, the structure of a GaN-based LED according to an embodiment of the invention will be described in detail.

As shown in FIG. 2, the GaN-based LED includes a buffer layer (not shown), an n-type GaN layer 111, an active layer 113, and a p-type GaN layer 115, which are sequentially laminated on an optically-transparent substrate 100, thereby forming a light emitting structure.

Preferably, the substrate 100 is formed of a transparent material including sapphire, the substrate being suitable for growing nitride semiconductor single crystal. Further, the substrate 100 can be formed of zinc oxide (ZnO), gallium nitride (GaN), silicon carbide (SiC) or aluminum nitride (AlN), in addition to sapphire.

Before the n-type GaN layer 111 is formed on the substrate 100, the buffer layer (not shown) is formed. The buffer layer formed of AlN/GaN enhances lattice matching with the substrate 100 formed of a transparent material including sapphire.

The n-type nitride semiconductor layer 111, the active layer 113, and the p-type nitride semiconductor layer 115 can be composed of a semiconductor material having a compositional formula of $Al_XIn_YGa_{1-X-Y}N$ ($0 \leq X \leq 1$, $0 \leq Y \leq 1$, $0 \leq X+Y \leq 1$). More specifically, the n-type nitride semiconductor layer 111 can be composed of a GaN or GaN/AlGaN layer doped with n-type conductive impurities. As for the n-type conductive impurities, Si, Ge, Sn and the like are used. Preferably, Si is mainly used. Further, the p-type nitride semiconductor layer 115 can be composed of a GaN or GaN/AlGaN layer doped with p-type conductive impurities. As for the p-type conductive impurities, Mg, Zn, Be and the like are used. Preferably, Mg is mainly used. Further, the active layer 113 can be composed of an InGaN/GaN layer having a multi-quantum well structure.

The active layer 113 can be formed to have one quantum well structure or a double-hetero structure.

On the p-type GaN layer 150, a transparent electrode 120 and a p-electrode 140 are sequentially formed, the p-electrode serving as a reflecting layer and an electrode at the same time. The transparent electrode 120 for enhancing a current spreading effect is composed of conductive metallic oxide such as ITO (Indium Tin Oxide).

More specifically, the transparent electrode 120 is composed of a compound formed by adding one or more elements, selected from a group consisting of tin, zinc, magnesium, copper, silver and aluminum, into an indium oxide. In this case, the elements are added by 1 to 30 wt % of the overall compound.

Portions of the active layer 113 and the p-type nitride semiconductor layer 115 are removed by mesa-etching such that a portion of the top surface of the n-type nitride semiconductor layer 111 is exposed.

On the exposed n-type nitride semiconductor layer 111, an n-electrode pad 130 is formed.

On the resulting structure between the transparent electrode 120 and the n-electrode 130, a protective film 150 is formed so as to prevent the p-electrode 140 and the n-electrode 130 from being electrically connected, the p-electrode 140 and the n-electrode 130 being formed on the transparent electrode 120.

The protective film 150 is composed of a transparent layer subjected to plasma oxidation or a transparent layer subjected to an ashing process. In other words, the protective film 150 is formed by plasma-oxidizing or ashing a transparent layer composed of the same material as a material forming the transparent electrode 120. The protective film 150 is formed of the same layer as the transparent electrode 120.

More specifically, the protective film 150 composed of a plasma-oxidized transparent layer has resistance of more than 1 kΩ, because oxygen content within the film is relatively higher than that of the transparent electrode 120 on the p-type GaN layer 115. The protective film 150 composed of a transparent layer subjected to an ashing process contains a larger amount of oxygen than the transparent electrode 120, which means that the protective film 150 contains sufficient oxygen such that the combination between metal and oxygen atom can be represented by a stoichiometric ratio.

Accordingly, the transparent layer forming the protective film 150 is preferably formed of a compound which is formed by adding one or more elements, selected from a group consisting of tin, zinc, magnesium, copper, silver and aluminum, into an indium oxide, similar to the transparent electrode 120. In this case, the elements are added by 1 to 30 wt % of the overall compound.

Although not shown, the GaN-based LED according to the invention further includes an adhesive layer 160 formed on the bottom surface of the protective film 150 which runs from an end of the transparent electrode 120 to an end of the n-electrode 130. The adhesive layer 160 serves to prevent the protective film 150 from being peeled off from the surface of the resulting structure between the transparent electrode 120 and the n-electrode 130.

The adhesive layer 160 is formed by adding one or more elements, selected from a group consisting of tin, zinc, magnesium, copper, silver and aluminum, into an indium oxide. In this case, different elements from those added into the transparent layer may be added. Alternately, a different amount of elements from the amount of those added into the transparent layer may be added.

Method of Manufacturing GaN-Based LED

Hereinafter, a method of manufacturing a GaN-based LED according to an embodiment of the invention will be described in detail with reference to FIGS. 2 and 3A to 3G.

FIGS. 3A to 3G are sectional views sequentially showing a process for explaining the method of manufacturing a GaN-based LED according to an embodiment of the invention.

As shown in FIG. 3A, an n-type GaN layer 111, an active layer 113, and a p-type GaN layer 115 are sequentially formed on a substrate 100. The n-type nitride semiconductor layer 111, the active layer 113, and the p-type nitride semiconductor layer 115 can be composed of a semiconductor material having a compositional formula of $Al_XIn_YGa_{1-X-Y}N$ ($0 \leq X \leq 1$, $0 \leq Y \leq 1$, $0 \leq X+Y \leq 1$) and can be formed by a well-known nitride growth process such as MOCVD or MBE. The substrate 100 may be a heterogeneous substrate such as a sapphire substrate and a silicon carbonate (SiC) substrate or a homogeneous substrate such as a nitride substrate, which is suitable for growing nitride semiconductor single crystal.

Although not shown, a buffer layer may be formed on the substrate 100, before the n-type GaN layer 111 is formed on the substrate 100. The buffer layer formed of a GaN layer enhances crystal growth.

As shown in FIG. 3B, a process of forming a mesa structure is performed in order to form an n-electrode (not shown) on the top surface of the n-type GaN layer 111. More specifically, the mesa-structure forming process includes forming first photoresist PR1 on a predetermined region of the top surface of the p-type GaN layer 115 excluding a region which is to be etched; and etching and removing predetermined regions of the p-type GaN layer 115 and the active layer 113 by using the first photoresist as an etching mask such that a portion of the top surface of the n-type GaN layer 111 is exposed.

Subsequently, the first photoresist PR1 is removed, and a transparent layer 200 is then formed on the entire surface of the resulting structure where a portion of the top surface of the n-type GaN layer 111 is exposed, as shown in FIG. 3. Preferably, the transparent layer 200 is formed of a compound composed by adding one or more elements, selected from a group consisting of tin, zinc, magnesium, copper, silver, and aluminum, into an indium oxide. In this case, the elements are added by 1 to 30 wt % of the overall compound.

Further, in order to enhance an adhesive force between the transparent layer 200 and the resulting structure where a portion of the top surface of the n-type GaN layer 111 is exposed, an adhesive layer 160 may be formed on the entire surface of the resulting structure where a portion of the top surface of the n-type GaN layer 111 is exposed, before the transparent layer 200 is formed. Preferably, the adhesive layer 160 is composed of a compound formed by adding one or more elements, selected from a group consisting of tin, zinc, magnesium, copper, silver, and aluminum, into an indium oxide. In this case, different elements from those added into the transparent layer may be added. Alternately, a different amount of elements from an amount of those added into the transparent layer may be added.

As shown in FIG. 3D, second photoresist PR2 is formed on a transparent electrode formation region, that is, on a predetermined region of the transparent layer 200 corresponding to the p-type GaN layer 115.

Next, a plasma oxidation process is performed on the transparent layer 200 in which the transparent electrode formation region is covered by the second photoresist PR2. Then, as shown in FIG. 3E, the transparent layer 200 exposed through the second photoresist PR2 is oxidized so as to change into a non-conductive thin film. Accordingly, the transparent 120 and a protective layer 150 are formed at the same time.

As for the method of forming the protective film 150, an ashing process may be performed instead of the plasma oxidation process. In the ashing process, the transparent layer is also changed into a non-conductive thin film which can serve as a protective film having the same performance as the protective layer formed by the plasma oxidation process.

As described above, the transparent layer for forming a transparent electrode is selectively changed into a non-conductive thin film, thereby forming the transparent electrode 120 and the protective film 150 at the same time. Therefore, it is possible to simplify the process of manufacturing a protective film, compared with the related art where a transparent electrode is formed, a separate $SiO_2$ film is deposited, and the $SiO_2$ film is then etched so as to form a protective film.

Further, when the protective film 150 is formed, the plasma oxidation process or the ashing process is performed instead of an etching process. Therefore, defective etching which might occur at the time of the etching process does not need to be concerned, which makes it possible to stabilize characteristics and reliability of the diode.

Further, the protective film 150 is formed by changing a transparent layer into a non-conductive thin film, the transparent layer being composed of a compound formed by adding one or more elements, selected from a group consisting of tin, zinc, magnesium, copper, silver, and aluminum, into an indium oxide. Therefore, it is possible to prevent the problem of the protective film composed of $SiO_2$ in the related art, that is, defective adhesion (for example, the protective film can be peeled off).

After that, a p-electrode 140 and an n-electrode 130 are formed on the transparent electrode 120 and the n-type GaN layer 111, respectively. The p-electrode 140 and the n-electrode 130 may be formed by using a known electrode formation technique.

Now, a method of forming a p-electrode and an n-electrode will be described with reference to FIGS. 3F and 3H.

As shown in FIG. 3F, third photoresist PR3 for exposing a portion of the n-type GaN layer 111 is formed on the resulting structure where the transparent electrode 120 and the protective film 150 are formed.

Next, the protective film 150 is selectively etched by using the third photoresist PR3 as an etching mask such that a portion of the top surface of the n-type GaN layer 111 is exposed.

As shown in FIG. 3G, the n-electrode 130 is formed on the exposed n-type GaN layer 111 by using the third photoresist PR3, and the third photoresist PR3 is removed.

After that, fourth photoresist PR4 defining a p-electrode formation region is formed on the resulting structure where the n-electrode 130 is formed.

Then, as shown in FIG. 2, the p-electrode 140 is formed on the p-electrode formation region, that is, on the transparent electrode 120 by using the fourth photoresist PR4. Finally, the fourth photoresist PR4 is removed.

As described above, the transparent electrode and the protective film are simultaneously formed by using a transparent layer composed of an indium oxide without a separate etching process. Therefore, it is possible to simplify the overall manufacturing process, thereby enhancing a production yield.

Further, an etching process for forming a protective film may be omitted. Therefore, defective etching which might occur at the time of the etching process does not need to be concerned, which makes it possible to stabilize characteristics and reliability of the diode.

Further, the protective film is formed by changing a transparent layer into a non-conductive thin film. The adhesive performance between the protective film and the electrode is enhanced, thereby preventing defective adhesion.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A GaN-based LED comprising:
   a substrate;
   an n-type GaN layer formed on the substrate;
   an active layer formed on a predetermined region of the n-type GaN layer;
   a p-type GaN layer formed on the active layer;
   an n-electrode formed on a portion of the n-type GaN layer on which the active layer is not formed;
   a transparent layer formed on a continuous surface ranging from the p-type GaN layer to the n-type GaN layer, the transparent layer consisting of a transparent electrode part located on the p-type GaN layer and a protective film part located on the continuous surface excluding the area where the transparent electrode part and the n-electrode are formed; and
   a p-electrode formed on the transparent electrode part,
   wherein the transparent electrode part is not covered by the protective film part,
   wherein the protective film part is in contact with the transparent electrode part and the n-electrode, and is derived from a portion of the transparent layer with increased oxygen content therein.

2. The GaN-based LED according to claim 1, wherein the protective film part is composed of a plasma-oxidized transparent layer.

3. The GaN-based LED according to claim 1, wherein the transparent layer is a compound formed by adding one or more elements, selected from a group consisting of tin, zinc, magnesium, copper, silver, and aluminum, into an indium oxide.

4. The GaN-based LED according to claim 3, wherein the elements are added by 1 to 30 wt % of the overall compound.

5. The GaN-based LED according to claim 1 further comprising
   a buffer layer formed between the substrate and the n-type GaN layer.

6. The GaN-based LED according to claim 1,
wherein the protective film part is composed of an ashing-processed transparent layer.

7. The GaN-based LED according to claim 1,
wherein the transparent layer is a compound formed by adding one or more elements, selected from a group consisting of tin, zinc, magnesium, copper, silver, and aluminum, into an indium oxide.

8. The GaN-based LED according to claim 7,
wherein the elements are added by 1 to 30 wt % of the overall compound.

9. The GaN-based LED according to claim 1 further comprising
a buffer layer formed between the substrate and the n-type GaN layer.

* * * * *